US007573959B2

(12) United States Patent
Hsiung et al.

(10) Patent No.: US 7,573,959 B2
(45) Date of Patent: Aug. 11, 2009

(54) METHOD AND APPARATUS FOR REMOVING IMPULSE NOISE

(75) Inventors: Da-Wei Hsiung, Tai-Nan (TW); Shun-An Yang, Chang-Hua Hsien (TW)

(73) Assignee: MediaTek Inc., Hsin-Chu Hsien (TW)

( * ) Notice: Subject to any disclaimer, the term of this patent is extended or adjusted under 35 U.S.C. 154(b) by 573 days.

(21) Appl. No.: 11/306,361

(22) Filed: Dec. 25, 2005

(65) Prior Publication Data

US 2007/0147558 A1 Jun. 28, 2007

(51) Int. Cl.

*H03D 1/04* (2006.01)
*H04D 1/06* (2006.01)
*H04L 1/00* (2006.01)
*H04B 1/10* (2006.01)

(52) U.S. Cl. ....................... 375/346; 375/278; 375/284; 375/285; 375/296; 375/348

(58) Field of Classification Search ................. 375/348, 375/346, 296, 285, 284, 278

See application file for complete search history.

(56) References Cited

U.S. PATENT DOCUMENTS 4,398,210 A 8/1983 Liu et al.
5,285,277 A 2/1994 Min
5,479,440 A 12/1995 Esfahani
5,703,904 A 12/1997 Langberg
6,385,261 B1 * 5/2002 Tsuji et al. .................. 375/346
6,795,559 B1 9/2004 Taura et al.
7,302,024 B2 * 11/2007 Arambepola ................ 375/347

FOREIGN PATENT DOCUMENTS

TW 384574 3/2000

OTHER PUBLICATIONS

J. L. Fernandez et al., "Modelling impulsive interference in DVB-T -statistical analysis, test waveforms and receiver performance.", EBU Technical Review, Jul. 2004, pp. 1-15.

* cited by examiner

*Primary Examiner*—Ted Wang
(74) *Attorney, Agent, or Firm*—Winston Hsu

(57) ABSTRACT

An impulse noise remover includes: a storage module for storing a plurality of digital values derived from a received signal; a calculating module coupled to the storage module for calculating a first detection value according to a first subset of the plurality of digital values, and for calculating a second detection value according to a second subset of the plurality of digital values; a control unit coupled to the calculating module for identifying a target digital value associated with impulse noise according to the first and the second detection values; and a correcting unit coupled to the storage module and the control unit for replacing the target digital value with a predetermined value.

23 Claims, 6 Drawing Sheets

METHOD AND APPARATUS FOR REMOVING IMPULSE NOISE

BACKGROUND

The disclosure relates to signal processing techniques, and more particularly, to methods and apparatuses for removing impulse noise in a received signal.

Impulse noise, which is usually caused by domestic electrical appliances or by vehicle ignition systems, comprises one or more relatively high amplitude pulses of relatively short duration. In a wireless communication system, the signal receiver is particularly susceptible to the impulse noise and the signal quality is thereby deteriorated.

In view of the foregoing, it can be appreciated that a substantial need exists for methods and apparatus that can effectively remove the impulse noise in a received signal in order to improve the signal quality.

SUMMARY

An exemplary embodiment of a method for removing impulse noise in a received signal is disclosed comprising: storing a plurality of digital values derived from the received signal; calculating a first detection value according to a first subset of the plurality of digital values; calculating a second detection value according to a second subset of the plurality of digital values; identifying a target digital value associated with impulse noise according to the first and second detection values; and replacing the target digital value with a predetermined value.

An exemplary embodiment of an impulse noise remover is disclosed comprising: a storage module for storing a plurality of digital values derived from a received signal; a calculating module coupled to the storage module for calculating a first detection value according to a first subset of the plurality of digital values, and for calculating a second detection value according to a second subset of the plurality of digital values; a control unit coupled to the calculating module for identifying a target digital value associated with impulse noise according to the first and second detection values; and a correcting unit coupled to the storage module and the control unit for replacing the target digital value with a predetermined value.

These and other objectives will no doubt become obvious to those of ordinary skill in the art after reading the following detailed description of the preferred embodiment that is illustrated in the various figures and drawings.

DETAILED DESCRIPTION

Figure 1:
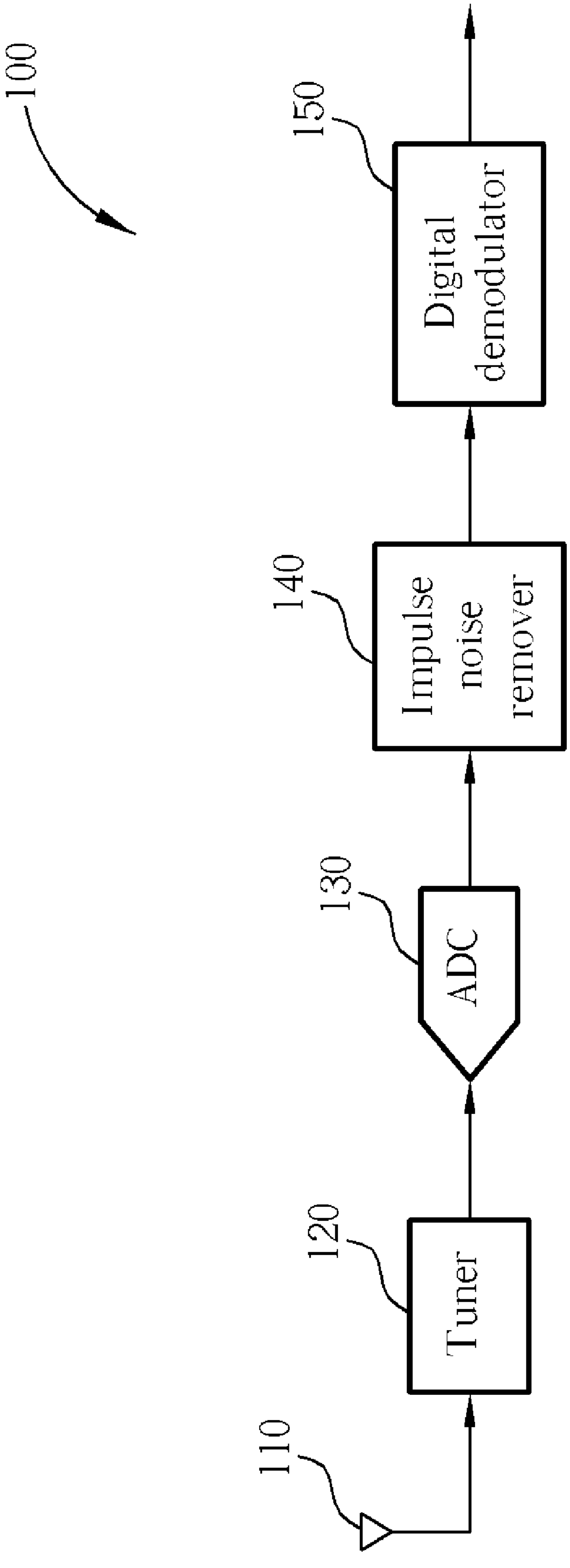
FIG. 1 is a block diagram of a wireless signal receiver according to an exemplary embodiment.

FIG. 1 shows a block diagram of a wireless signal receiver 100 according to an exemplary embodiment of the disclosure. The signal receiver 100 comprises an antenna 110 for receiving a signal; a tuner 120 coupled to the antenna 110 for down-converting the received signal; an analog-to-digital converter (ADC) 130 coupled to the tuner 120 for converting the received signal into digital values; an impulse noise remover 140 coupled to the ADC 130 for removing impulse noise in the received signal utilizing a digital means; and a digital demodulator 150 coupled to the impulse noise remover 140 for demodulating the digital values generated from the impulse noise remover 140. In practice, the impulse noise remover 140 is applicable in various signal receivers, such as a DVB-T (Digital Video Broadcasting-Terrestrial) receiver, a DVB-H (Digital Video Broadcasting-Handheld) receiver, a DAB (Digital Audio Broadcasting) receiver, etc.

Figure 2:
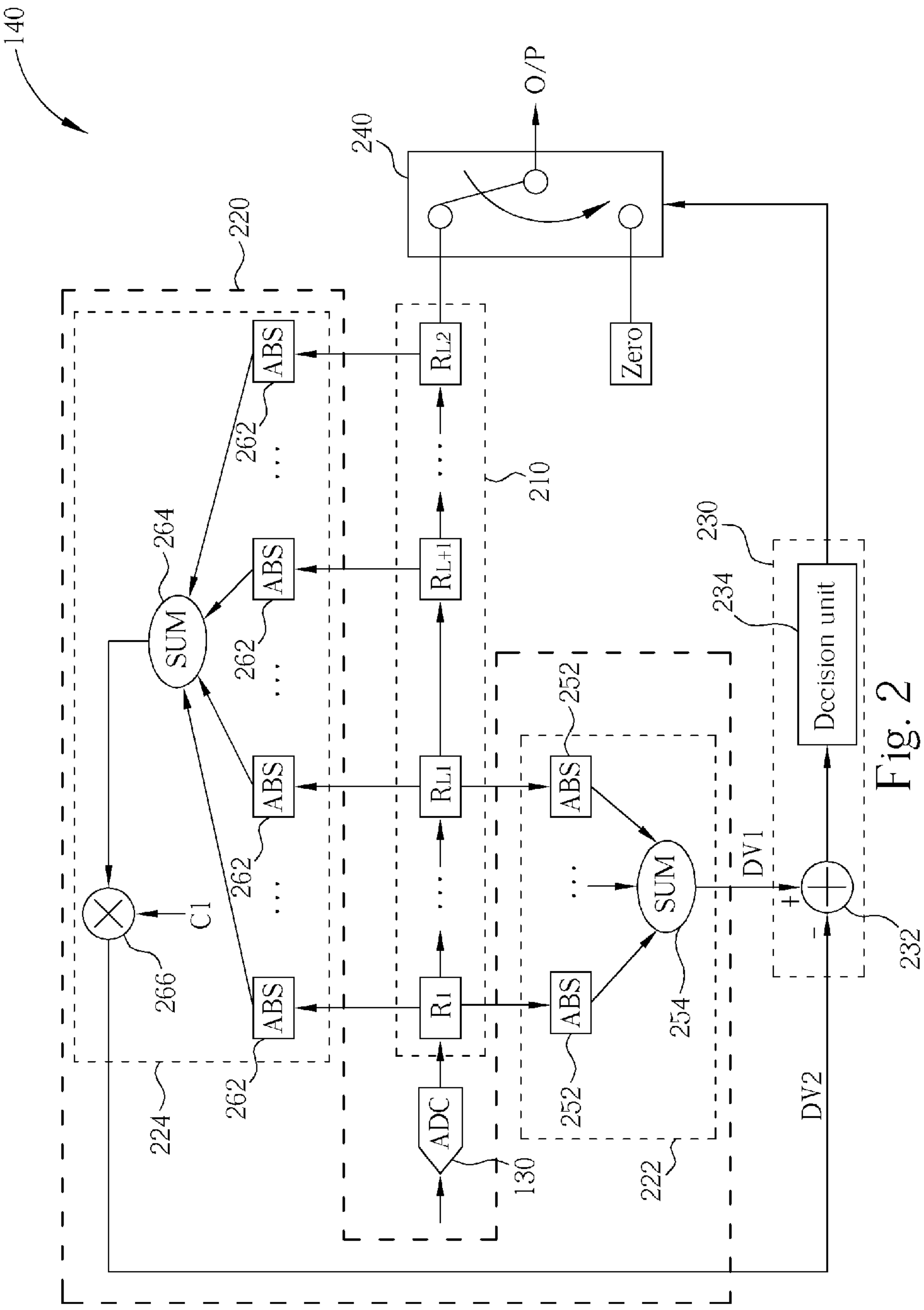
FIG. 2 is a simplified block diagram of the impulse noise remover of FIG. 1 according to a first embodiment.

Please refer to FIG. 2, which shows a simplified block diagram of the impulse noise remover 140 according to a first embodiment of the disclosure. In this embodiment, the impulse noise remover 140 comprises a storage module 210; a calculating module 220 coupled to the storage module 210; a control unit 230 coupled to the calculating module 220; and a correcting unit 240 coupled to the storage module 210 and the control unit 230. Hereinafter, the operations of the impulse noise remover 140 will be explained with reference to FIG. 3.

Figure 3:
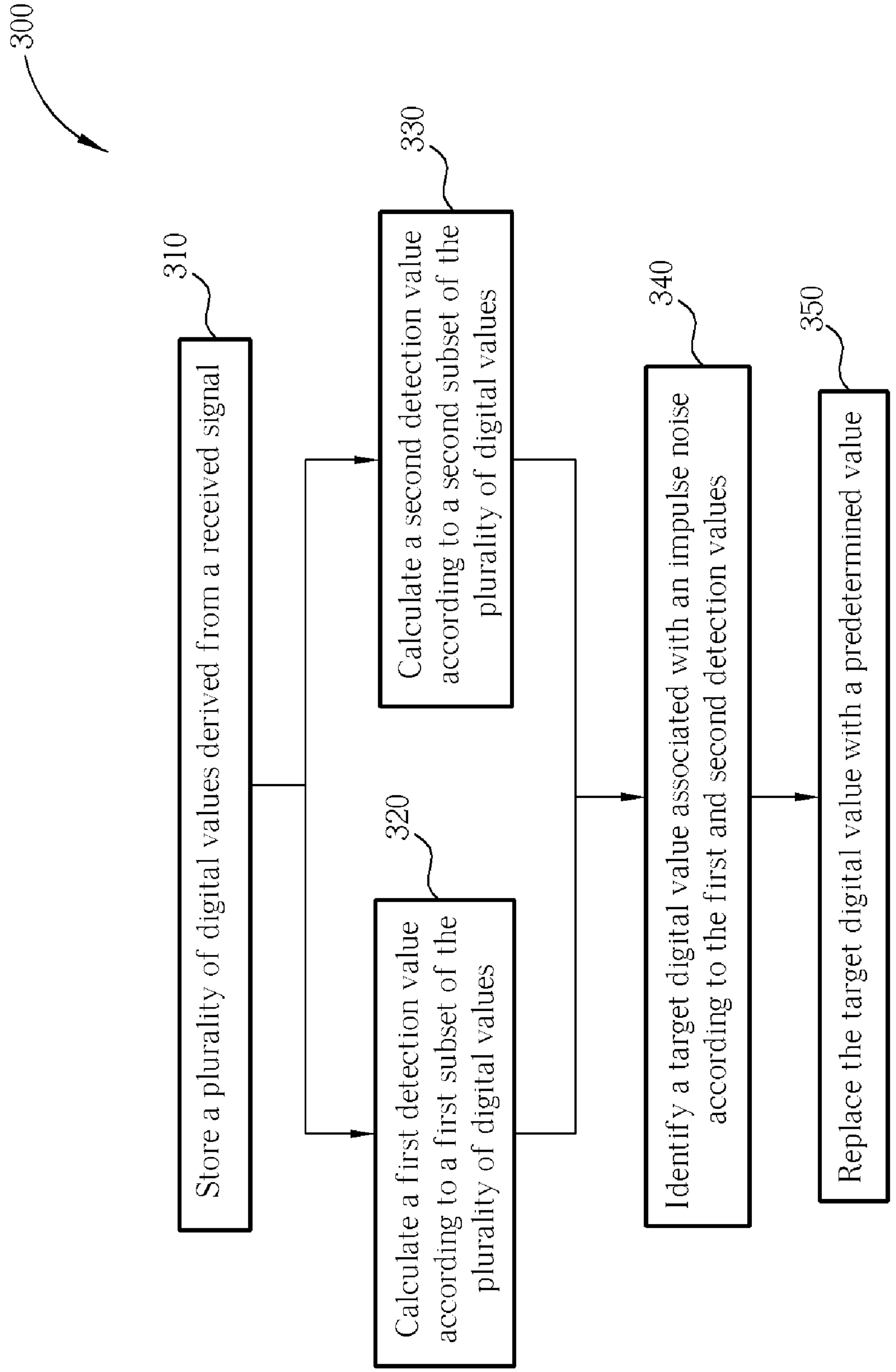
FIG. 3 is a flowchart illustrating a method for removing impulse noise in a received signal according to an exemplary embodiment.

FIG. 3 is a flowchart 300 illustrating a method for removing impulse noise in a received signal according to an exemplary embodiment. Steps of the flowchart 300 are described in the following paragraphs.

In step 310, the storage module 210 stores a plurality of digital values derived from a received signal. As illustrated previously, the plurality of digital values are generated by the ADC 130. The storage module 210 of this embodiment is implemented with a shift register containing a plurality of registers $R_1$ through $R_{L2}$. This is merely an example rather than a restriction of the practical implementations. In practice, the storage module 210 may be a buffer, a memory, or other storage medium.

In steps 320 and 330, the calculating module 220 calculates a first detection value DV1 according to a first subset of the plurality of digital values, and calculates a second detection value DV2 according to a second subset of the plurality of digital values. In this embodiment, the first subset of the plurality of digital values are digital values stored in the registers $R_1$ through $R_{L2}$ of the storage module 210, and the second subset of the plurality of digital values are digital values stored in the registers $R_1$ through $R_{L1}$ of the storage module 210. A shown in FIG. 2, the first subset covers the second subset, and the first subset contains more digital values than the second subset.

On the other hand, since the digital values stored in the storage module 210 are converted from the received signal by the ADC 130, the first subset of the plurality of digital values corresponds to a first reception period of the signal receiver 100, and the second subset of the plurality of digital values corresponds to a second reception period shorter than the first reception period. In this case, the second reception period is part of the first reception period, and the beginning of the first reception period is prior to the beginning of the second reception period.

In this embodiment, the calculating module 220 comprises a first calculator 222 and a second calculator 224. The first calculator 222 is arranged for implementing the operations of step 320 and the second calculator 224 is arranged for implementing the operations of step 330. As shown in FIG. 2, the first calculator 222 comprises a plurality of absolute value (ABS) detectors 252 and a summer (SUM) 254 for calculating an first absolute sum of digital values of the first subset, i.e., the digital values stored in the registers $R_1$ through $R_{L1}$, to be the first detection value DV1. The second calculator 224 comprises a plurality of ABS detectors 262, a summer 264, and a multiplier 266. These ABS detectors 262 and the summer 264 are employed to calculate a second absolute sum of digital values of the second subset, i.e., the digital values stored in the registers $R_1$ through $R_{L2}$. The multiplier 266 then multiplies the second absolute sum by a coefficient C1 to generate the second detection value DV2.

The coefficient C1 is configured for making the first and second detection values DV1 and DV2 to have a same comparing basis. Accordingly, the coefficient C1 can be set to a ratio of the number of digital values of the first subset to the number of digital values of the second subset. For example, if L2 is two times L1, the coefficient C1 may be set to 0.5. In practice, the multiplier 266 can be moved from the output of the summer 264 to the output of the summer 254 of the first calculator 222. In such a design, the coefficient C1 can be set to a ratio of the number of digital values of the second subset to the number of digital values of the first subset, for example, the coefficient C1 may be set to 2 if L2 is two times L1.

In addition, it is allowed to respectively configure a first multiplier and a second multiplier at the output of the summer 254 and the output of the summer 264 in order to make the first and second detection values DV1 and DV2 to have the same comparing basis. For example, the first multiplier can be designed to multiply the first absolute sum generated from the summer 254 by 1/L1 and the second multiplier can be designed to multiply the second absolute sum generated from the summer 264 by 1/L2.

In one aspect, the first detection value DV1 represents a relatively short-term detecting result of amplitude of the received signal and the second detection value DV2 represents a relatively long-term detecting result of the amplitude of the received signal.

In step 340, the control unit 230 identifies a target digital value associated with impulse noise according to the first and second detection values DV1 and DV2. In the embodiment shown in FIG. 2, the control unit 230 comprises a computing unit 232 for computing a difference between the first detection value DV1 and the second detection value DV2; and a decision unit 234 coupled to the computing unit 232 for locating the target digital value by comparing the difference with a predetermined threshold. In practice, the computing unit 232 may be a subtracter, which is utilized for subtracting the second detection value DV2 from the first detection value DV1. Hereinafter, the operations of the decision unit 234 are described with reference to FIG. 4.

Figure 4:
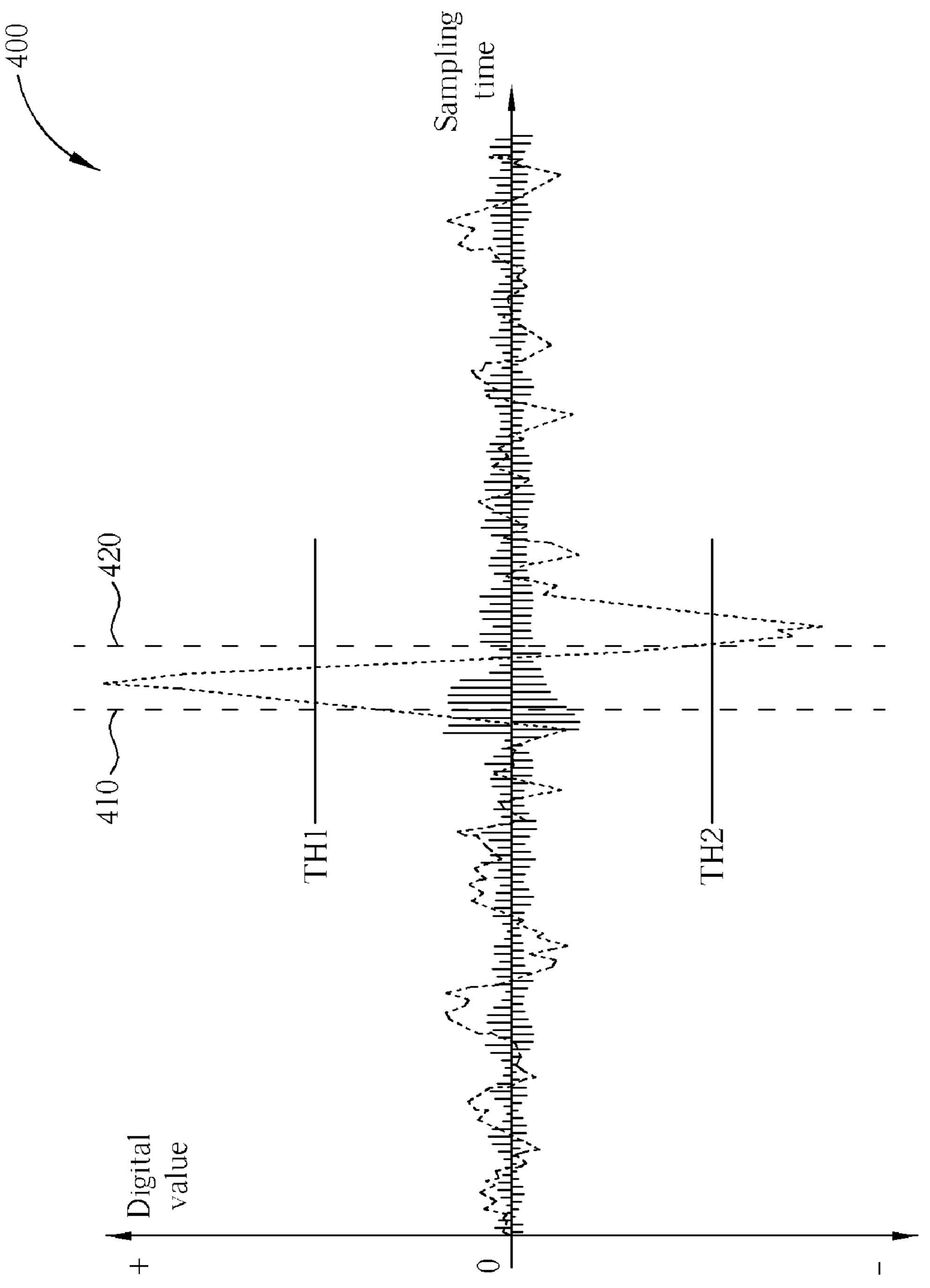
FIG. 4 is a signal diagram illustrating an exemplary embodiment of locating impulse noise in the received signal.

FIG. 4 shows a signal diagram 400 illustrating an exemplary embodiment of locating impulse noise in the received signal. In FIG. 4, the solid lines represent the digital values outputted from the ADC 130, and the dotted line is the output of the computing unit 232 of the control unit 230. For the purpose of explanatory convenience in the following description, the digital sum value of the received signal is herein assumed to be zero.

In a period between time points 410 and 420, the output of the computing unit 232 firstly exceeds a first predetermined threshold TH1 and then falls to a second predetermined threshold TH2, the decision unit 234 so determines that impulse noise begins near time 410 and ends near time 420. Preferably, the first and second predetermined thresholds TH1 and TH2 are substantially symmetrical with respect to the digital sum value (zero) of the received signal. Note that, if the computing unit 232 is designed to subtract the first detection value DV1 from the second detection value DV2, the determining condition for the beginning of impulse noise and the determining condition for the end of impulse noise are correspondingly reversed.

According to the determinations described above, the control unit 230 is able to identify a target digital value derived from impulse noise in step 340.

In step 350, the correcting unit 240 then replaces the target digital value with a predetermined value under the control of the control unit 230. In this embodiment, the predetermined value is the digital sum value of the received signal, i.e., zero. The correcting unit 240 may be implemented with a switch or a multiplexer. In operations, the control unit 230 can simply control the correcting unit 240 to switch to the predetermined value when the beginning of impulse noise is detected and then control the correcting unit 240 to switch to the output of the storage module 210 when the end of impulse noise is detected.

In practical applications, there is a timing gap between the time at which the beginning/end of impulse noise is detected by the control unit 230 and the actual time the beginning/end of the impulse noise is present in the received signal. Accordingly, the control unit 230 can compensate for a certain delay to the correcting timing of the correcting unit 240.

Figure 5:
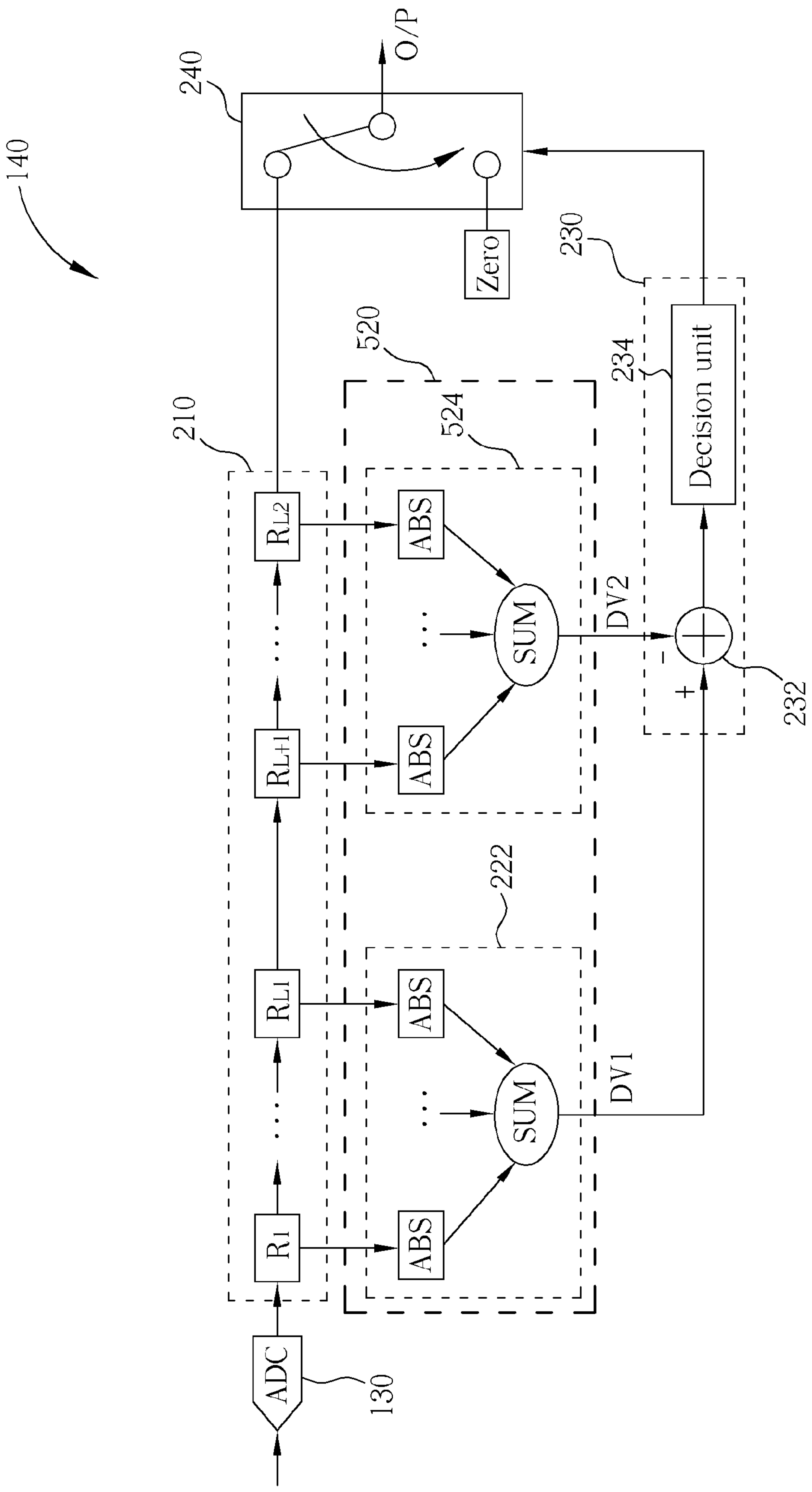
FIG. 5 is a simplified block diagram of the impulse noise remover of FIG. 1 according to a second embodiment.

Please refer to FIG. 5, which shows a simplified block diagram of the impulse noise remover 140 according to a second embodiment of the disclosure. In this embodiment, the impulse noise remover 140 comprises the storage module 210; a calculating module 520 coupled to the storage module 210; the control unit 230; and the correcting unit 240. Since the impulse noise remover 140 of this embodiment is similar to the embodiment shown in FIG. 2, components having the same implementations and operations as that of the previous embodiment are labeled the same for the sake of clarity.

As shown, the calculating module 520 comprises the first calculator 222 for implementing the operations of step 320, and a second calculator 524 for implementing the operations of step 330. In this embodiment, the second subset of the plurality of digital values are those digital values stored in the registers $R_{L+1}$ through $R_{L2}$, i.e., the first reception period corresponding to the first subset does not overlap a second reception period corresponding to the second subset. In practice, the length of the first reception period may be substantially the same as the length of the second reception period. If the length of the first reception period is not the same as the length of the second reception period, a multiplier is required to multiply the calculated result generated by the first calculator 222 or the calculated result generated by the second calculator 524 by a proper coefficient in order to make the first and second detection values DV1 and DV2 to have a fair comparing basis.

In another aspect, the first detection value DV1 generated by the first calculator 222 represents a relatively later detecting result of amplitude of the received signal and the second detection value DV2 generated by the second calculator 524 represents a relatively earlier detecting result of amplitude of the received signal. If the first and second subsets of the plurality of digital values have an identical number of digital values (i.e., L2 is two times L1), the impulse noise remover 140 shown in FIG. 5 is electrically equivalent to the impulse noise remover 140 shown in FIG. 2.

Figure 6:
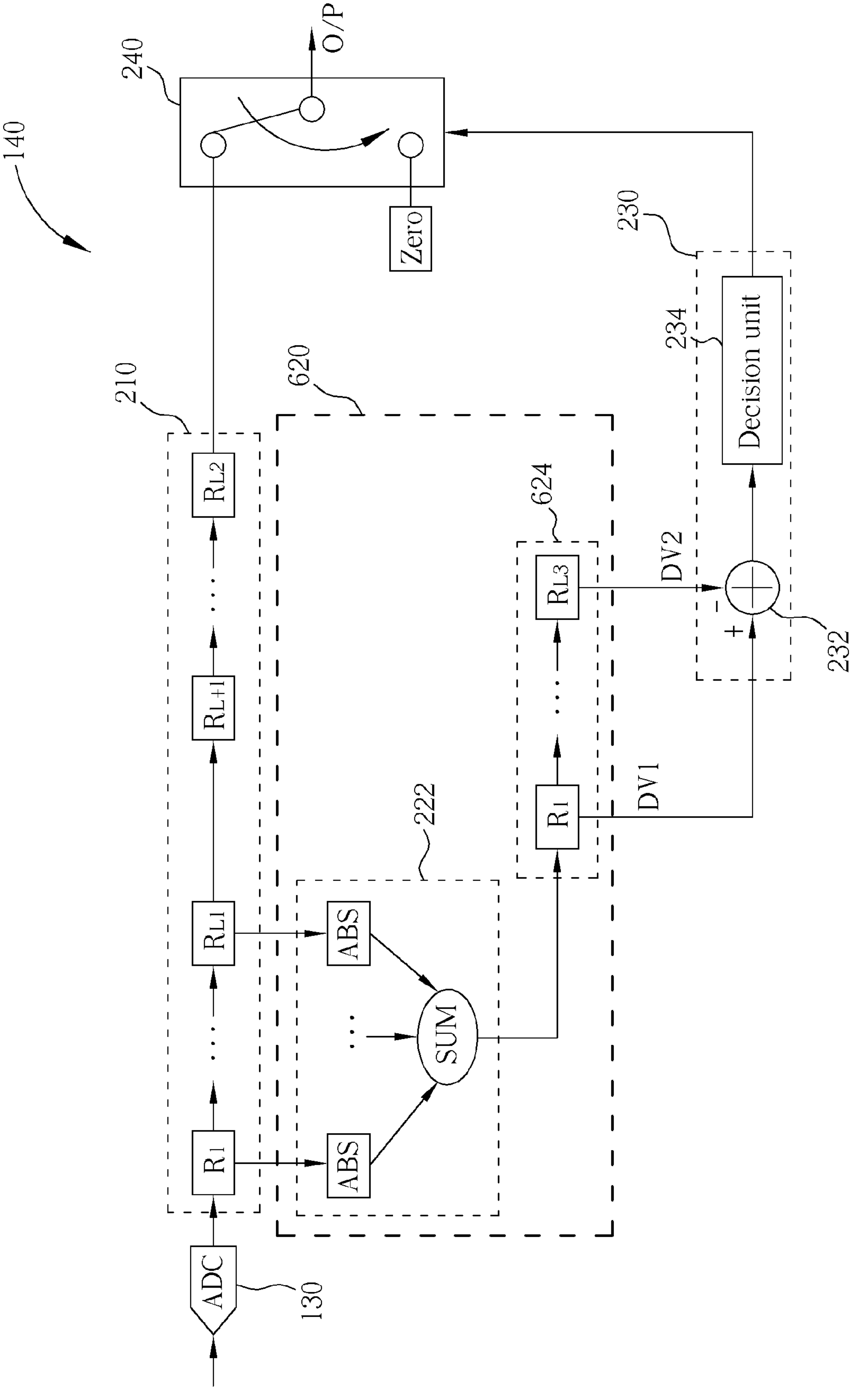
FIG. 6 is a simplified block diagram of the impulse noise remover of FIG. 1 according to a third embodiment.

FIG. 6 is a simplified block diagram of the impulse noise remover 140 according to a third embodiment. The impulse noise remover 140 of this embodiment utilizes a calculating module 620 to generate the first and second detection values DV1 and DV2. As shown, the calculating module 620 comprises the first calculator 222 and a shift register 624. The shift register 624 is arranged for buffering or delaying the calculated results generated from the first calculator 222. If L3 is equal to L1, the impulse noise remover 140 of FIG. 6 is electrically equivalent to the impulse noise remover 140 of FIG. 2. In this embodiment, the operations of steps 320 and 330 are realized by the first calculator 222 of the calculating module 620.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for removing impulse noise in a received signal, comprising:

storing a plurality of digital values derived from the received signal in a storage module;

calculating a first detection value according to a first plurality of the digital values by a calculating module;

calculating a second detection value according to a second plurality of the digital values;

identifying a target digital value associated with impulse noise according to the first and second detection values; and replacing the target digital value with a predetermined value;

wherein the first plurality of digital values corresponds to a first reception period, and the second plurality of digital values corresponds to a second reception period.

2. The impulse noise removing method of claim 1, wherein the beginning of the first reception period is prior to the beginning of the second reception period.

3. The impulse noise removing method of claim 2, wherein the second reception period does not overlap the first reception period.

4. The impulse noise removing method of claim 2, wherein the length of the first reception period is substantially the same as the length of the second reception period.

5. The impulse noise removing method of claim 1, wherein the first reception period is longer than the second reception period.

6. The impulse noise removing method of claim 5, wherein the first reception period overlaps the second reception period.

7. The impulse noise removing method of claim 6, wherein the second reception period is part of the first reception period.

8. A method for removing impulse noise in a received signal, comprising:

storing a plurality of digital values derived from the received signal in a storage module;

calculating a first detection value according to a first plurality of the digital values by a calculating module;

calculating a second detection value according to a second plurality of the digital values;

identifying a target digital value associated with impulse noise according to the first and second detection values; and replacing the target digital value with a predetermined value;

wherein the identifying step comprises:

computing a difference between the first and second detection values; and locating the target digital value by comparing the difference with a predetermined threshold.

9. A method for removing impulse noise in a received signal, comprising:

storing a plurality of digital values derived from the received signal in a storage module;

calculating a first detection value according to a first plurality of the digital values by a calculating module;

calculating a second detection value according to a second plurality of the digital values;

identifying a target digital value associated with impulse noise according to the first and second detection values; and replacing the target digital value with a predetermined value;

wherein the step of calculating the first detection value comprises:

calculating a first absolute sum of digital values of the first plurality of the digital values; and determining the first detection value according to the first absolute sum; and the step of calculating the second detection value comprises:

calculating a second absolute sum of digital values of the second plurality of the digital values; and determining the second detection value according to the second absolute sum.

10. The impulse noise removing method of claim 9, wherein the step of determining the second detection value further comprises:

multiplying the second absolute sum by a second coefficient to obtain the second detection value.

11. The impulse noise removing method of claim 10, wherein the step of determining the first detection value further comprises:

multiplying the first absolute sum by a first coefficient to obtain the first detection value.

12. An impulse noise remover comprising:

a storage module for storing a plurality of digital values derived from a received signal;

a calculating module coupled to the storage module for calculating a first detection value according to a first plurality of the digital values, and for calculating a second detection value according to a second plurality of the digital values;

a control unit coupled to the calculating module for identifying a target digital value associated with impulse noise according to the first and second detection values; and a correcting unit coupled to the storage module and the control unit for replacing the target digital value with a predetermined value;

wherein the control unit comprises:

a computing unit for computing a difference between the first and second detection values; and a decision unit coupled to the computing unit for locating the target digital value by comparing the difference with a predetermined threshold.

13. An impulse noise remover comprising:

a storage module for storing a plurality of digital values derived from a received signal;

a calculating module coupled to the storage module for calculating a first detection value according to a first plurality of the digital values, and for calculating a second detection value according to a second plurality of the digital values;

a control unit coupled to the calculating module for identifying a target digital value associated with impulse noise according to the first and second detection values; and a correcting unit coupled to the storage module and the control unit for replacing the target digital value with a predetermined value;

wherein the calculating module comprises:

a first calculator coupled to the storage module for calculating the first detection value according to the first plurality of the digital values; and a second calculator coupled to the storage module for calculating the second detection value according to the second plurality of the digital values; and wherein the first calculator calculates a first absolute sum of digital values of the first plurality of the digital values and generates the first detection value according to the first absolute sum; and the second calculator calculates a second absolute sum of digital values of the second plurality of the digital values and generates the second detection value according to the second absolute sum.

14. The impulse noise remover of claim 13, wherein the second calculator comprises:

a second multiplier for multiplying the second absolute sum by a second coefficient to obtain the second detection value.

15. The impulse noise remover of claim 14, wherein the first calculator comprises:

a first multiplier for multiplying the first absolute sum by a first coefficient to obtain the first detection value.

16. An impulse noise remover comprising:

a storage module for storing a plurality of digital values derived from a received signal;

a calculating module coupled to the storage module for calculating a first detection value according to a first plurality of the digital values, and for calculating a second detection value according to a second plurality of the digital values;

a control unit coupled to the calculating module for identifying a target digital value associated with impulse noise according to the first and second detection values; and a correcting unit coupled to the storage module and the control unit for replacing the target digital value with a predetermined value;

wherein the first plurality of digital values corresponds to a first reception period, and the second plurality of digital values corresponds to a second reception period.

17. The impulse noise remover of claim 16, wherein the beginning of the first reception period is prior to the beginning of the second reception period.

18. The impulse noise remover of claim 17, wherein the second reception period does not overlap the first reception period.

19. The impulse noise remover of claim 17, wherein the length of the first reception period is substantially the same as the length of the second reception period.

20. The impulse noise remover of claim 16, wherein the first reception period is longer than the second reception period.

21. The impulse noise remover of claim 20, wherein the first reception period overlaps the second reception period.

22. The impulse noise remover of claim 21, wherein the second reception period is part of the first reception period.

23. An impulse noise remover comprising:

a storage module for storing a plurality of digital values derived from a received signal;

a calculating module coupled to the storage module for calculating a first detection value according to a first plurality of the digital values, and for calculating a second detection value according to a second plurality of the digital values;

a control unit coupled to the calculating module for identifying a target digital value associated with impulse noise according to the first and second detection values; and a correcting unit coupled to the storage module and the control unit for replacing the target digital value with a predetermined value;

wherein the calculating module calculates a first absolute sum of digital values of the first plurality of the digital values as the first detection value and calculates a second absolute sum of digital values of the second plurality of the digital values as the second detection value.

* * * * *